United States Patent [19]

Pease et al.

[11] Patent Number: 4,760,348
[45] Date of Patent: Jul. 26, 1988

[54] BROADBAND IN-LINE AMPLIFIER FOR SUBMARINE ANTENNAS

[75] Inventors: Brian L. Pease; Raymond J. Phillips, both of Oakdale; Anthony R. Susi, Waterford, all of Conn.

[73] Assignee: The United States of America as represented by the Secretary of the Navy

[21] Appl. No.: 33,278

[22] Filed: Apr. 2, 1987

[51] Int. Cl.[4] .................... H03F 1/00; H01Q 1/34
[52] U.S. Cl. .................... 330/151; 330/306; 343/709
[58] Field of Search ............... 330/125, 126, 151, 306; 343/709, 710; 340/850–852; 455/142–144, 269, 280, 286, 287, 291, 293

[56] References Cited

U.S. PATENT DOCUMENTS

| 3,805,164 | 4/1974 | Callaway | 330/306 X |
| 3,965,426 | 6/1976 | Ringland | 455/286 X |
| 4,531,234 | 7/1985 | Bell | 455/291 X |

FOREIGN PATENT DOCUMENTS 8105622  7/1983  Netherlands ............ 343/709

Primary Examiner—James B. Mullins
Attorney, Agent, or Firm—Arthur A. McGill; Prithvi C. Lall; Michael J. McGowan

[57] ABSTRACT

A towable broadband submarine antenna system for deployment in the ocean during operation comprises an antenna element including a metallic termination tip and a length of single conductor buoyant cable. A broadband amplifier connects to the antenna element and provides separate paths for the VLF/LF and the HF/VHF signals with amplification provided only to the HF/VHF signals. The signal from the broadband amplifier is further transmitted on a coaxial cable.

1 Claim, 2 Drawing Sheets

4,760,348

BROADBAND IN-LINE AMPLIFIER FOR SUBMARINE ANTENNAS

STATEMENT OF GOVERNMENT INTEREST

The invention described herein may be manufactured and used by or for the Government of the United States of America for governmental purposes without the payment of any royalties thereon or therefor.

This patent application is co-pending with related patent application Ser. No. 07/033,279 entitled "A Towable Buoyant Cable Antenna System" by the same inventors, filed on Apr. 2, 1987, the same filing data as this patent application.

BACKGROUND OF THE INVENTION

(1) Field of the Invention

The present invention is a broadband in-line amplifier. This amplifier is part of a towed buoyant cable antenna system that is deployed in seawater. In the present system an antenna element is comprised of a termination tip that is connected to a buoyant cable. The termination tip is grounded to the seawater. The in-line broadband amplifier is connected between the buoyant cable of the antenna element and a second buoyant cable. The second buoyant cable extends inward toward a submarine.

The broadband in-line amplifier is designed to operate on the frequencies of interest. These frequencies are those between 10 kHz–200 kHz and 2 MHz–160 Mz. The frequencies referred to in the specification are as follows: VLF (very low frequency) 3–30 kHz, LF (low frequency) 30–300 kHz, MF (medium frequency) 300 kHz–3 MHz, HF (high frequency) 3–30 MHz and VHF (very high frequency) 30–300 MHz.

(2) Description of the Prior Art

Previous amplifiers could neither amplify nor pass VLF/LF signals. These VLF/LF signals were received on the portion of the shield of the coaxial feedline floating on the surface of the water, using the amplifier housing as grounding electrode and the hull of the submarine as a ground return to the seawater. The performance of such a VLF/LF antenna varied with both the amount of the antenna stored on the ship and the amount on the ocean surface. The only alternative was to build an antenna without an amplifier. This was fine for VLF/LF reception but limited to only about 12 MHz maximum by the loss in the feedline.

SUMMARY OF THE INVENTION

The present invention overcomes the above difficulties by providing a broadband in-line amplifier that has high HF/VHF gain and improved VLF/LF reception compared to previous designs. The high gain overcomes the attenuation of a long feedline of 1900 feet with 160 MHz cutoff. The broadband in-line amplifier comprises two parts, an HF/VHF amplifier loop to amplify higher frequency signals and a filter network loop to allow VLF/LF signals to pass around the HF/VHF amplifier loop without deterioration.

DESCRIPTION OF THE PREFERRED EMBODIMENT

Figure 1:
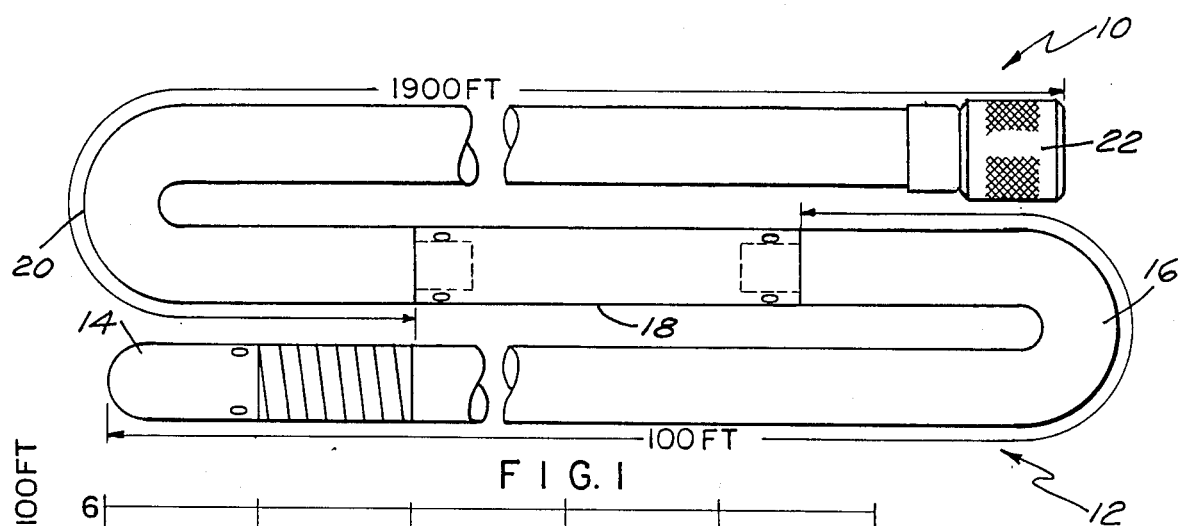
FIG. 1 is a pictorial representation of a deployed antenna system in accordance with the present invention.

Referring now to FIG. 1 there is shown a towed buoyant cable antenna system 10 that is deployed in the ocean during operations. The buoyant antenna element 12 comprises a metallic termination tip 14 and a length of single conductor buoyant cable 16 connected to the termination tip 14. In a typical system the antenna element 12 is approximately 100 feet in length. A broadband in-line amplifier 18 connects to the single conductor buoyant cable 16. A coaxial cable 20 extends from the broadband in-line amplifier 18 to an inboard connector 22. In a typical system the cable 20 and connector 22 extend for approximately 1900 feet in length. The inboard connector 22 is suitable for connecting to a connector on a submarine (not shown).

Figure 2:
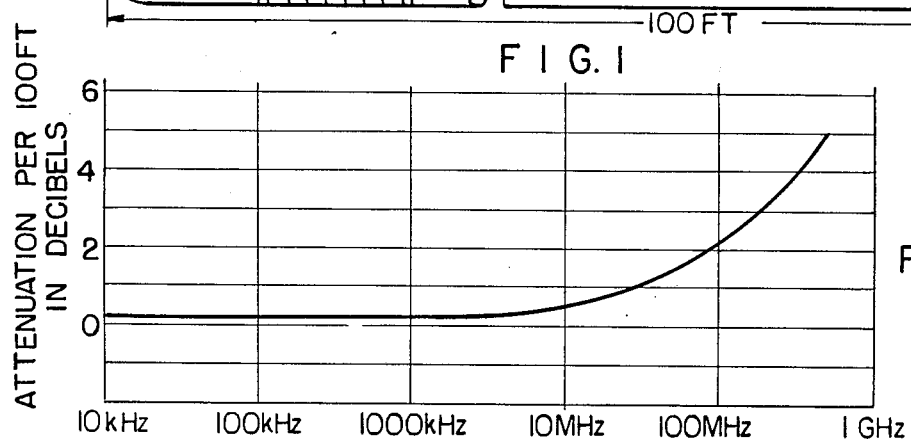
FIG. 2 is a graphical representation of the attenuation vs frequency in a buoyant cable of FIG. 1.

FIG. 2 shows a graph of the cable attenuation vs frequency per 1900 feet in an RG-384 cable. The RG-384 cable is a typical coaxial type buoyant cable used in conducting signals to a submarine from a towed antenna system deployed in water. The RG-384 cable is suitable for use as the coaxial cable 20 of FIG. 1. It is to be noted that the attenuation of the cable increases as the frequency rises. Although such graphs are normally given in lengths such as 100 feet, the present graph is for 1900 feet of cable to correspond to the length given in FIG. 1.

Figure 3:
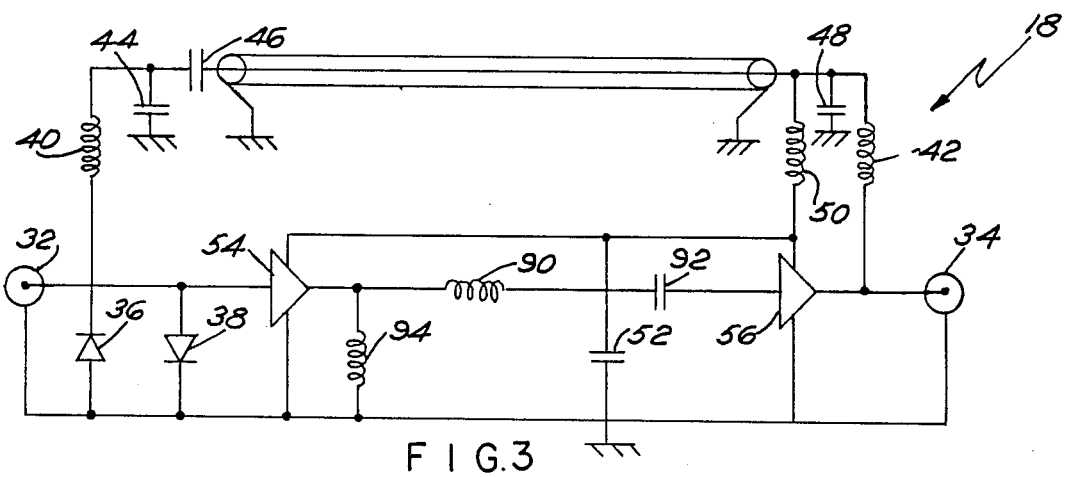
FIG. 3 is a schematic diagram of the broadband in-line amplifier system of FIG. 1.

The schematic diagram of FIG. 3 shows the components of the broadband in-line amplifier 18. The broadband in-line amplifier 18 has RF input and output terminals 32 and 34. A pair of overload/impulse protection diodes 36 and 38 are located between the RF input terminal 32 and ground. Inductors 40 and 42, and capacitor 44 form a low pass filter which routes the VLF/LF signals between RF input terminal 32 and RF output terminal 34, bypassing the amplification portion of the circuit. DC blocking capacitor 46 is located in the loop that conducts the VLF/LF signals and therefore must be of a rating that will conduct signals as low as the VLF/LF frequency range. Capacitor 48 increases attenuation at VHF in the loop that conducts the VLF/LF signals. This prevents oscillation resulting from feedback of the VHF signal from the output terminal 34 to the input terminal 32 of the amplifier through the low pass filter loop. Inductor 50, an RF choke, provides power to the amplifier circuits from RF output 34. Capacitor 52 provides a shunt to ground for the VLF/LF noise generated by the transistors in amplifiers 54 and 56. This is to prevent the VLF/LF noise from getting into the loop that conducts the VLF/LF signals. Small internal DC blocking capacitors on the inputs and outputs of amplifiers 54 and 56 also perform a VLF/LF noise reducing function by acting as high-pass filters.

Figure 4:
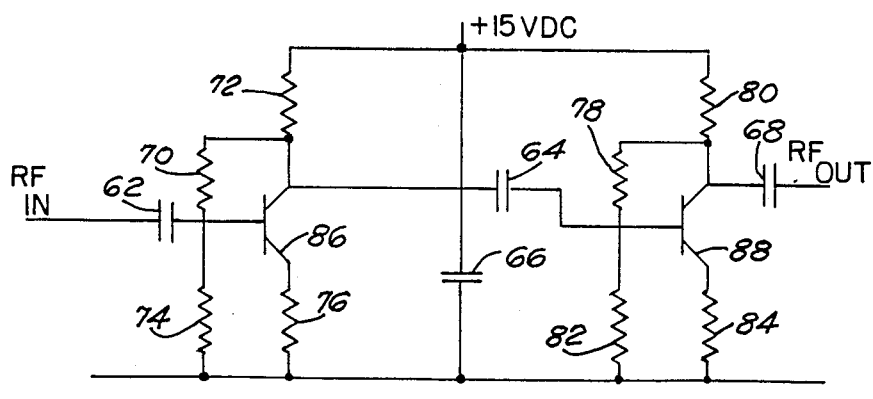
FIG. 4 is a schematic diagram of an amplifier comprising part of the in-line amplifier system of FIG. 3.

The HF/VHF amplification system is comprised mainly of the individual amplifiers 54 and 56. Each of the amplifiers 54 and 56 are identical and have a two stage thin-film amplifier with 50 ohm input and output impedances. FIG. 4 shows a schematic diagram of one of the two identical amplifiers 54 and 56. The amplifiers 54 and 56 each have four capacitors 62, 64, 66 and 68. Capacitors 62 and 68 are small internal DC blocking capacitors that also perform a VLF/LF noise reducing function by acting as high pass filters. Capacitor 64 is an interstage DC blocking capacitor. Capacitor 66 is a high frequency bypass. Resistors 70, 72, 74, 76, 78, 80, 82 and 84 provide biasing and feedback for the two transistor amplifiers 86 and 88. Returning to FIG. 3 there is shown an inductor 90 and capacitor 92 form a frequency compensation circuit. This causes the gain of the amplifier system to gradually rise from 2 to 160 MHz. This increases dynamic range at the lower frequencies and roughly matches the attenuation characteristic of the 1900 foot coaxial feedline. Inductor 94 is connected between the output of amplifier 54 and ground. It is of a magnitude to shunt the VLF/LF frequency noise to ground while appearing as an open circuit to higher frequencies. This aids in reducing the VLF/LF noise at the output of amplifier 56 by virtually eliminating the VLF/LF noise at the output of amplifier 54. HF/VHF amplifier loop is capable of gains varying from 24 db at 2 MHz to 60 db at 160 MHz. The noise figure of the complete system averages about 5 db at normal ambient temperature.

Figure 5:
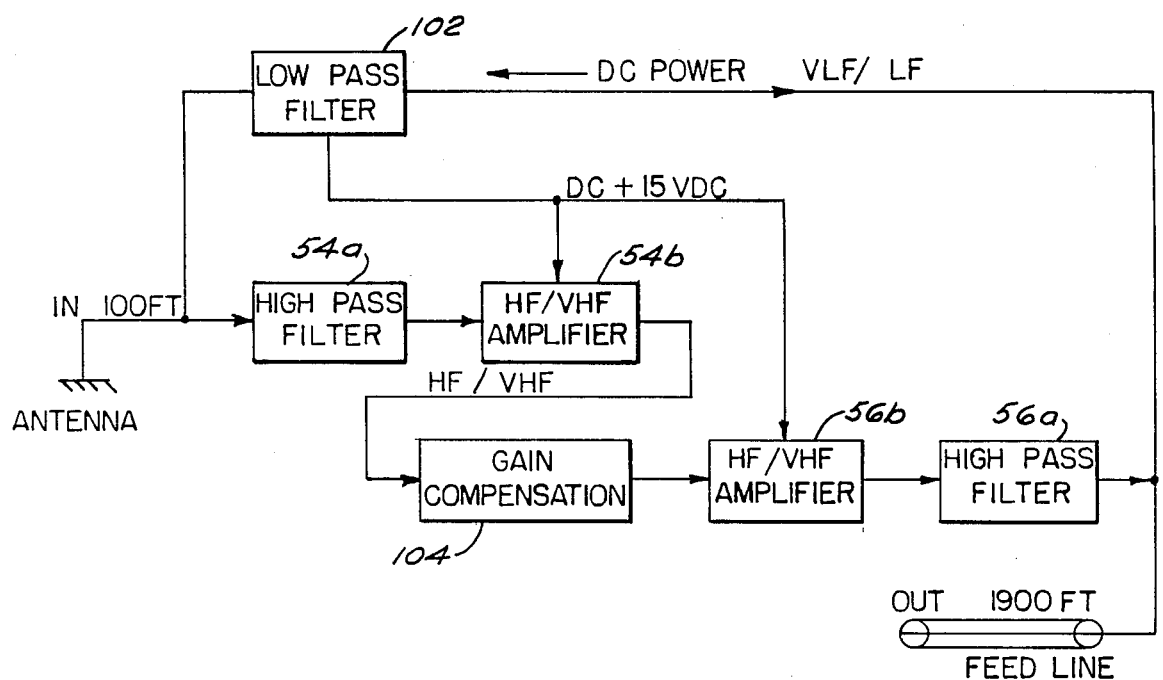
FIG. 5 is a block diagram of the antenna system of FIG. 1.

FIG. 5 shows a block diagram of the schematic diagram of FIG. 3 with some of the shunts and blocking components omitted. Both FIGS. 3 and 5 should be referred to for the following description. There is shown the low pass filter 102 comprised of inductors 40 and 42 and capacitor 44 for passing the VLF/LF signal from RF input 32 to RF output 34. The DC power supply of 15 VDC to amplifiers 54 and 56 is shown. It passes through inductor 42 of low pass filter 102. There is also shown the HF/VHF amplification system that includes amplifiers 54 and 56 which comprise high pass filter components 54a and 56a, and HF/VHF amplifiers 54b and 56b. Amplifiers 54 and 56 were shown in more detail in FIG. 4. The HF/VHF amplification system also includes gain compensator 104 that comprises inductor 36 and capacitor 38.

There has therefore been described an in-line broadband amplifier that amplifies HF/VHF signals and to a lesser degree MF signals in the same manner while simultaneously allowing unamplified, undegraded VLF/LF reception using the same antenna and feedline. It is because of the high attenuation of HF/VHF signals in water compared to VLF/LF signals that makes the system highly desirable.

It will be understood that many additional changes in the details, materials, steps and arrangement of parts, which have been herein described and illustrated in order to explain the nature of the invention, may be made by those skilled in the art within the principle and scope of the invention as expressed in the appended claims.

What is claimed is:
1. A broadband in-line amplifier comprising:
an input terminal;
an output terminal;
a low pass filter loop connected to said input terminal for receiving signals, said low pass filter loop having means for conducting received signals of a frequency between 10 kHz–200 kHz to said output terminal and inhibiting higher frequency signals;
said low pass filter loop further comprises a low pass filter including a single T section having a pair of series inductors and a first capacitor connected between said series inductors and ground, a second capacitor, being a d.c. blocking capacitor, connected in series between said inductors, and a third capacitor connected between said series inductors and ground for attenuating VHF signals;
a high frequency amplification loop connected to said input terminal for receiving signals, said high frequency amplification loop having means for amplifying received signals of a frequency between 2 MHz–160 MHz and conducting the amplified signals to said output terminal, and inhibiting lower frequency signals; and
said high frequency amplification loop further comprises a first amplifier having a high pass filter at its input and an HF/VHF amplifier, a second amplifier having an HF/VHF amplifier and a high pass filter at the output of said second amplifier, and a gain compensator located between said first and second amplifier.

* * * * *